(12) United States Patent
Yabe

(10) Patent No.: US 11,088,691 B2
(45) Date of Patent: Aug. 10, 2021

(54) OSCILLATION CIRCUIT AND INTERFACE CIRCUIT

(71) Applicant: Kioxia Corporation, Minato-ku (JP)

(72) Inventor: Hiroo Yabe, Nerima (JP)

(73) Assignee: Kioxia Corporation, Minato-ku (JP)

( * ) Notice: Subject to any disclaimer, the term of this patent is extended or adjusted under 35 U.S.C. 154(b) by 0 days.

(21) Appl. No.: 16/927,002

(22) Filed: Jul. 13, 2020

(65) Prior Publication Data

US 2021/0021267 A1 Jan. 21, 2021

(30) Foreign Application Priority Data

Jul. 17, 2019 (JP) .............................. JP2019-132079

(51) Int. Cl.
*H03K 3/03* (2006.01)
*H03K 19/0175* (2006.01)
*G04F 10/00* (2006.01)
*H03K 3/037* (2006.01)

(52) U.S. Cl.
CPC ... *H03K 19/017509* (2013.01); *G04F 10/005* (2013.01); *H03K 3/037* (2013.01); *H03K 3/0315* (2013.01)

(58) Field of Classification Search
CPC .. G04F 10/005; H03K 3/0231; H03K 3/0315; H03K 3/0322; H03K 19/017509
USPC ............................................ 331/57, 111, 143
See application file for complete search history.

(56) References Cited

U.S. PATENT DOCUMENTS

| | | | |
|---|---|---|---|
| 9,379,714 B1 | 6/2016 | Xiu | |
| 9,584,132 B2 | 2/2017 | Kim et al. | |
| 10,895,850 B1* | 1/2021 | Elkholy | ................ H03M 3/368 |
| 2007/0075785 A1* | 4/2007 | Kossel | .................... H03L 7/089 |
| | | | 331/16 |
| 2012/0069884 A1 | 3/2012 | Sakurai | |
| 2014/0098271 A1* | 4/2014 | Hagihara | ................ H03M 1/08 |
| | | | 348/302 |
| 2019/0013820 A1* | 1/2019 | Ohhata | .................... H03M 1/16 |
| 2019/0052226 A1* | 2/2019 | Rozental | ................... H03L 7/24 |
| 2019/0187628 A1* | 6/2019 | Chu | .................... H01J 49/0036 |
| 2020/0235744 A1* | 7/2020 | Kushnir | ............... H03L 7/0997 |

FOREIGN PATENT DOCUMENTS

| JP | 2012-70087 A | 4/2012 |
|---|---|---|
| JP | 2016-134916 A | 7/2016 |

* cited by examiner

*Primary Examiner* — Levi Gannon

(74) *Attorney, Agent, or Firm* — Oblon, McClelland, Maier & Neustadt, L.L.P.

(57) ABSTRACT

An oscillation circuit has a voltage generator configured to generate a linearly changing voltage, a voltage level of which linearly changes as time passes, a first comparator configured to compare the linearly changing voltage with a first reference voltage, a second comparator configured to compare the linearly changing voltage with a second reference voltage having a higher voltage level than the first reference voltage, a time-to-digital converter configured to output a bit sequence signal in accordance with a time difference between a time when the first comparator detects that the linearly changing voltage matches the first reference voltage and a time when the second comparator detects that the linearly changing voltage matches the second reference voltage, and an oscillator configured to generate an oscillation signal that oscillates at a frequency according to the bit sequence signal.

20 Claims, 10 Drawing Sheets

OSCILLATION CIRCUIT AND INTERFACE CIRCUIT

CROSS REFERENCE TO RELATED APPLICATIONS

This application is based upon and claims the benefit of priority from the prior Japanese Patent Application No. 2019-132079, filed on Jul. 17, 2019, the entire contents of which are incorporated herein by reference.

FIELD

Embodiments described herein relate generally to an oscillation circuit and an interface circuit.

BACKGROUND

In semiconductor integrated circuits, clock signals are often generated by a ring oscillator including a frequency locked loop (FLL). The ring oscillator of this type has a problem in that it takes time on the order of microseconds to milliseconds after the ring oscillator enter an enable state to lock the clock signal frequency A CR oscillator may be used to shorten the lock time. However, CR oscillators are mainly used to generate low-frequency clock signals since their frequency accuracy are not so high.

DETAILED DESCRIPTION

Figure 1:
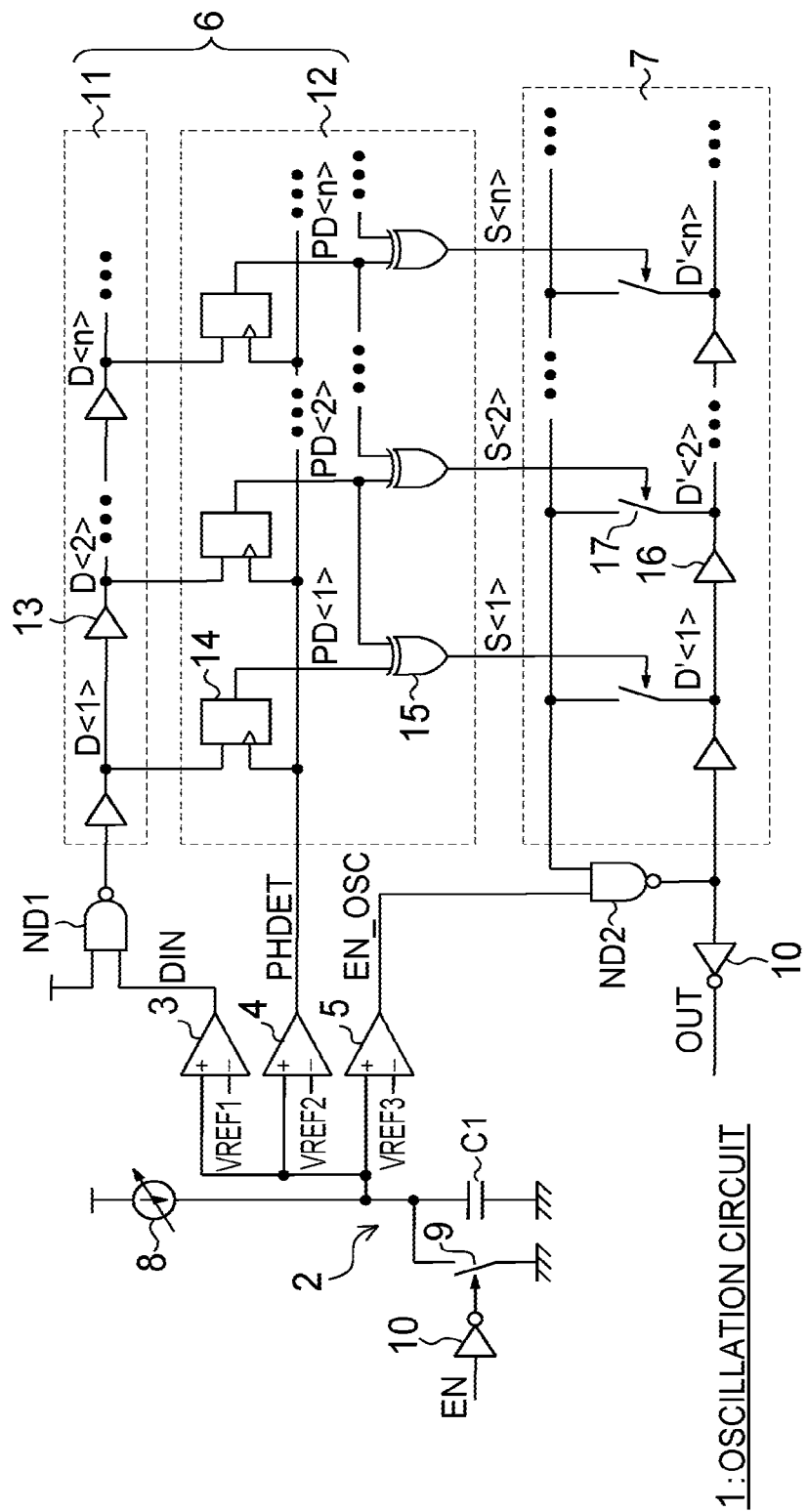
FIG. 1 is a circuit diagram of an oscillation circuit according to a first embodiment.

Embodiments of the oscillation circuit and the interface circuit will now be described below with reference to the accompanying drawings. In the following descriptions, main parts of the oscillation circuit and the interface circuit will be described. However, the oscillation circuit and the interface circuit may have other elements or functions that are not described below or illustrated in the drawings.

First Embodiment

FIG. 1 is a circuit diagram of an oscillation circuit 1 according to a first embodiment. The oscillation circuit 1 shown in FIG. 1 includes a voltage generator 2, a first comparator 3, a second comparator 4, a third comparator 5, a time-to-digital converter 6, and an oscillator 7.

The voltage generator 2 generates a linearly changing voltage, the voltage level of which linearly changes as the time passes. The voltage generator 2 includes a current source 8 and a capacitor C1 that are connected in series between a power supply voltage node and a ground node, a switch 9 that is connected in parallel with the capacitor C1, and an inverter 10 that controls the switching of the switch 9. The inverter 10 is set at LOW when an enable signal EN is HIGH. When the output of the inverter 10 becomes LOW, the switch 9 is turned off, and the charge brought by a current from the current source 8 increases in the capacitor C1. As a result, the voltage generator 2 generates a linearly changing voltage. When the enable signal EN is LOW, the output of the inverter 10 becomes HIGH, the switch 9 is turned on, and the capacitor C1 is short-circuited. As a result, the charge accumulated in the capacitor C1 is discharged, and the output voltage of the voltage generator 2 becomes a ground voltage (0V).

The first comparator 3 compares the linearly changing voltage generated by the voltage generator 2 with a first reference voltage VREF1, and outputs a signal indicating the comparison result. More specifically, the first comparator 3 outputs a signal DIN that becomes HIGH when the linearly changing voltage is equal to or greater than the first reference voltage VREF1.

The second comparator 4 compares the linearly changing voltage generated by the voltage generator 2 with a second reference voltage VREF2, and outputs a signal indicating the comparison result. More specifically, the second comparator 4 outputs a signal PHDET that becomes HIGH when the linearly changing voltage is equal to or greater than the second reference voltage VREF2. The voltage level of the second reference voltage VREF2 is greater than that of the first reference voltage VREF1.

The third comparator 5 compares the linearly changing voltage generated by the voltage generator 2 with a third reference voltage VREF3, and outputs a signal indicating the comparison result. More specifically, the third comparator 5 outputs a signal EN_OSC that becomes HIGH when the linearly changing voltage is equal to or greater than the third reference voltage VREF3. The voltage level of the third reference voltage VREF3 is greater than the second reference voltage VREF2.

While the linearly changing voltage generated by the voltage generator 2 is increasing, if the value of the linearly changing voltage becomes equal to or greater than the value of the first reference voltage VREF1, the output signal DIN from the first comparator 3 becomes HIGH. Thereafter, if the value of the linearly changing voltage becomes equal to or greater than that of the second reference voltage VREF2, the output signal PHDET from the second comparator 4 becomes HIGH, and then if the value of the linearly changing voltage becomes equal to or greater than that of the third reference voltage VREF3, the output signal EN_OSC from the third comparator 5 becomes HIGH.

The logic of the output signal DIN from the first comparator 3 is inverted at a NAND gate ND1. The signal DIN is then inputted to the time-to-digital converter 6. The NAND gate ND1 is provided to invert the logic of the output signal from the first comparator 3, and may be replaced with a different logic gate such as an inverter 10.

The time-to-digital converter 6 outputs a bit sequence signal that corresponds to a time difference between the time at which the linearly changing voltage is determined to match the first reference voltage VREF1 by the first comparator 3 and the time at which the linearly changing voltage is determined to match the second reference voltage VREF2 by the second comparator 4. The time-to-digital converter 6 includes a delay circuit 11 and a phase detector 12.

The delay circuit 11 includes a plurality of first delay units 13 that are connected in series and have the same signal propagation delay time. The first delay units 13 propagate the output signal from the first comparator 3, more accurately the output signal from the NAND gate ND1, while delaying it. The output signal from the NAND gate ND1 is inputted to the first one of the series-connected delay units 13. Each first delay unit 13 is, for example, a buffer element. When the output signal from the first comparator 3 changes from LOW to HIGH, the output signal from the NAND gate ND1 changes from HIGH to LOW, and the output signals from the first delay units 13 in the delay circuit 11 sequentially change from HIGH to LOW from the NAND gate ND1 side. Thus, the first delay units 13 in the delay circuit 11 sequentially propagate the signal edge indicating the signal logic change from HIGH to LOW.

The phase detector 12 generates the bit sequence signal based on the output signals from the first delay units 13. The phase detector 12 includes a plurality of retention units 14. Each of the retention units 14 corresponds to one of the first delay units 13, and retains the output signal of the corresponding first delay unit 13 at the time when the linearly changing voltage is determined to match the second reference voltage VREF2 by the second comparator 4. Each retention unit 14 is a D flip-flop, for example, and capable of making zero the setup time of the output signal from the corresponding first delay unit 13 and the output signal from the second comparator 4, which are inputted to the retention unit 14. Each retention unit 14 retains the output signal from the corresponding first delay unit 13 at the time when the output signal from the second comparator 4 changes from LOW to HIGH. The time when the output signal from the second comparator 4 changes from LOW to HIGH is later than the time when the output signal from the first comparator 3 changes from LOW to HIGH. In the period between those times, the output signals of the N first delay units 13 (where N is an integer equal to or greater than 1) counted from the first one of the series-connected first delay units 13 in the delay circuit 11 change from HIGH to LOW. Each of the N retention units 14, to which the output signal from the corresponding first delay unit 13 has been inputted, retains the LOW data, and others retain the HIGH data. As the result, a retention signal from each of the retention units 14 becomes to correspond to the time difference between the time at which the linearly changing voltage matches the first reference voltage VREF1 and the time at which the linearly changing voltage matches the second reference voltage VREF2.

The phase detector 12 also includes a plurality of EXOR gates 15 each calculating the exclusive OR of the output signals from adjacent two retention units 14. If both output signals from the adjacent two retention units 14 are LOW, the output signal of the corresponding EXOR gate 15 is LOW. If, among the plural retention units 14 retaining the output signals from the plural first delay units 13 as described above, the retention signal from each of N retention units 14 is LOW, the output signal from each of (N−1) EXOR gates 15 counted from the left side in FIG. 1 is LOW, and the output signal from the N-th EXOR gate is HIGH. The phase detector 12 outputs a bit sequence signal including the output signals from the plural EXOR gates 15.

The oscillator 7 generates an oscillation signal that oscillates at a frequency corresponding to the bit sequence signal outputted from the phase detector 12. The oscillator 7 includes a plurality of second delay units 16 connected in series, the signal propagation delay time for which is the same, a plurality of switches 17 for changing whether the output signals from the second delay units 16 are sent back to the first one of the second delay units 16, and a NAND gate ND2 capable of switching the logic of the input node of the first one of the series-connected second delay units 16. The output signal OUT of the oscillator 7 is inverted by an inverter 10. This inverter 10 is provided to make the output of the oscillation circuit 1 at the LOW potential while the oscillation circuit 1 stops the oscillating operation. Depending on the type of application, the inverter 10 may be omitted.

The switches 17 are provided to correspond to the EXOR gates 15. When the output signal of an EXOR gate 15 becomes HIGH, the corresponding switch 17 is turned on, and the output signal from the second delay unit 16 connected to the corresponding switch 17 is inputted to the NAND gate ND2. The NAND gate ND2 inverts the output signal of the second delay unit 16 connected to the switches 17 that is turned on while the output signal of the third comparator 5 is HIGH, and inputs the inverted signal to the first one of the series-connected second delay units 16. Since the switches 17 in the oscillator 7 may be omitted, in the first embodiment, the signal propagation delay time while the signal is passing through the switches 17 is assumed to be zero.

The oscillator 7 is therefore a ring oscillator 7 in which a plurality of second delay units 16, the number of which corresponds to the number of retention units 14 retaining the LOW state, are connected in a ring shape. As the number of connected second delay units 16 increases in the ring oscillator 7, the oscillation frequency of the oscillation signal decreases.

As described above, in the first embodiment, the total number of NAND gate ND1 and first delay units 13 of the delay circuit 11, which can propagate the signal edge during a period from the time when the linearly changing voltage matches the first reference voltage VREF1 to the time when the linearly changing voltage matches the second reference voltage VREF2 is set to be the same as the total number of NAND gate ND2 and the second delay units 16. As a result, the period of time between the time when the linearly changing voltage matches the first reference voltage VREF1 and the time when the linearly changing voltage matches the second reference voltage VREF2 is a half of the oscillation frequency of the oscillator 7 including the NAND gate ND2 and the second delay units 16.

Figure 2:
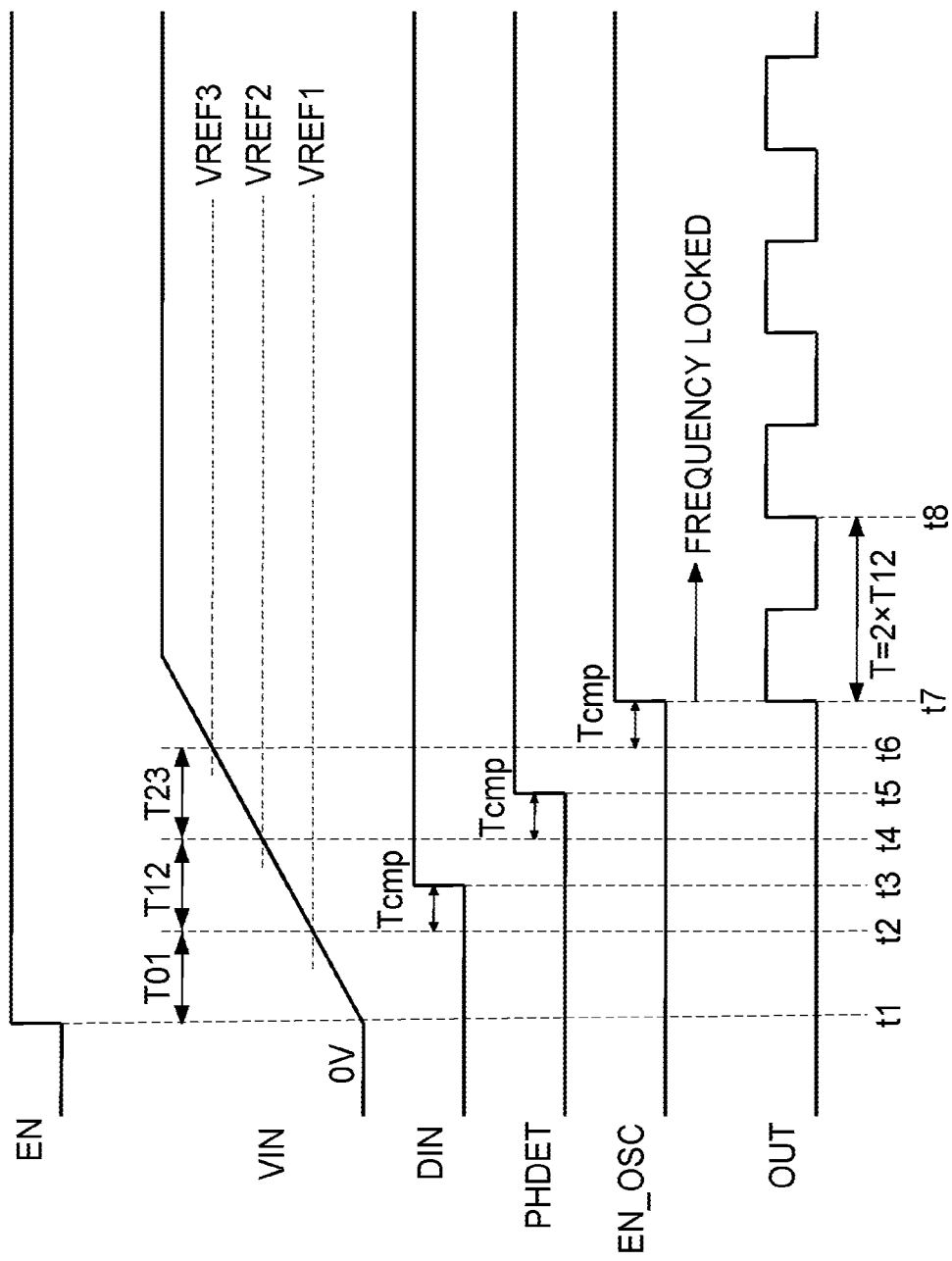
FIG. 2 is a timing chart of respective parts arranged in the oscillation circuit shown in FIG. 1.

FIG. 2 is a timing chart of respective parts arranged in the oscillation circuit 1 shown in FIG. 1. The operation of the oscillation circuit 1 shown in FIG. 1 will be described below with reference to FIG. 2. Before time t1, the enable signal is LOW, and the switch 9 of the voltage generator 2 is in the ON state. Therefore, the capacitor C1 discharges. The output voltage from the voltage generator 2 before time t1 is therefore at a ground voltage (0V). When the enable signal changes from LOW to HIGH at time t1, the switch 9 in the voltage generator 2 is turned off. Therefore, a current from the current source 8 is accumulated in the capacitor C1, and the output voltage from the voltage generator 2 starts increasing linearly as a function of time.

At time t2, the first comparator 3 detects that the output voltage from the voltage generator 2 becomes equal to or greater than the first reference voltage VREF1, and then changes its output signal from LOW to HIGH (time t3). When the output signal from the first comparator 3 changes from LOW to HIGH, the output of the NAND gate ND1 changes from HIGH to LOW, and the output signals from the series-connected first delay units 13 in the delay circuit 11 are sequentially changes from HIGH to LOW from the first one of the first delay units 13 (from the left side in FIG. 1).

At time t4, the second comparator 4 detects that the output voltage from the voltage generator 2 becomes equal to or greater than the second reference voltage VREF2, and then changes its output signal from LOW to HIGH (time t5). When the output signal from the second comparator 4 changes from LOW to HIGH, the retention units 14 in the phase detector 12 retain the output signals from the corresponding first delay units 13. The number of retention units 14 retaining LOW is the same as the number of first delay units 13 with their output signals being changed from HIGH to LOW during a period from the time when the output signal from the first comparator 3 changes from LOW to HIGH to the time when the output signal from the second comparator 4 changes from LOW to HIGH. If the first comparator 3 and the second comparator 4 have the same circuit configuration, the period from time t2 to time t3 is the same as the period from time t3 to time t4, Tcmp, and the period from the time when the output signal from the first comparator 3 changes from LOW to HIGH to the time when the output signal from the second comparator 4 changes from LOW to HIGH matches the period T12 from time t2 to time t4.

Each of the EXOR gates 15 in the phase detector 12 calculates the exclusive OR of the output signals from adjacent two retention units 14. If both the output signals from the two retention units 14 are LOW, the output signal from the corresponding EXOR gate 15 is LOW. If the output signals from the first to N-th retention units 14 counted from the left side of FIG. 1 is LOW and the output signal from the (N+1)-th retention unit 14 is HIGH, the output signals from the first to (N−1)-th EXOR gates 15 are LOW and the output signal from the N-th EXOR gate 15 is HIGH. Therefore, the first to (N−1)-th switches 17 of the oscillator 7 counted from the left side are in the OFF state, and the N-th switch 17 is turned ON. Before time t7, however, the output signal from the third comparator 5 is LOW, and the output signal from the NAND gate ND2 is fixed to HIGH. Therefore, the oscillator 7 does not perform the oscillation operation.

At time t6, the third comparator 5 detects that the output voltage of the voltage generator 2 reaches equal to or greater than the third reference voltage VREF3, and changes its output signal from LOW to HIGH (time t7), and the output signal from the NAND gate ND2 changes from HIGH to LOW. This allows the second delay units 16 of the oscillator 7 to function as the ring oscillator 7, and to perform the oscillation operation. The number of connected second delay units 16 in the ring oscillator 7 is equal to the number of retention units 14 retaining zero in the phase detector 12.

In the oscillation circuit 1 shown in FIG. 1, the delay time is the same for the NAND gate ND1, the NAND gate ND2, the first delay units 13, and the second delay units 16. Therefore, the oscillation cycle T of the oscillator 7 can be expressed as T=2×T12.

The oscillator 7 is capable of locking the oscillation frequency at the time when the output signal from the NAND gate ND2 changes to LOW, and the lock time required to lock the oscillation frequency is expressed as T01+T12+T23+Tcmp, where T01 is a period from time t1 at which the enable signal changes from LOW to HIGH to the time t2 when the value of the output voltage from the voltage generator 2 becomes the same as the value of the first reference voltage VREF1, T12 is a period from the time t2 when value of the output voltage from the voltage generator 2 becomes the value of the first reference voltage VREF1 to the time t4 when the value of the output voltage from the voltage generator 2 becomes the value of the second reference voltage VREF2, T23 is a period from the time t4 when the value of the output voltage from the voltage generator 2 becomes the value of the second reference voltage VREF2 to the time t6 when the value of the output voltage from the voltage generator 2 becomes the value of the third reference voltage VREF3, and Tcmp is a period from the time t6 when the value of the output voltage from the voltage generator 2 becomes the value of the third reference voltage VREF3 to the time t7 when the output signal from the third comparator 5 changes to HIGH.

The period of time T12 is a half of the oscillation cycle of the oscillator 7. By appropriately selecting the first to third reference voltages VREF1, VREF2, and VREF3, and accelerating the operations of the first to third comparators 3, 4, and 5, the oscillation frequency can be locked within one to two cycles of the oscillation signal.

The oscillation cycle T=2×T12 of the oscillator 7 is determined by the current flowing through the current source 8 in the voltage generator 2, the capacitance of the capacitor C1, and the difference between the first reference voltage VREF1 and the second reference voltage VREF2. The oscillation cycle T may be arbitrarily set by controlling those factors.

By generating the first reference voltage VREF1 and the second reference voltage VREF2 by means of a band gap reference (BGR) circuit that is not shown, the fluctuations in oscillation frequency of the oscillation signal may be curbed irrespective of the manufacturing process, the power supply voltage, and the temperature.

In the oscillation circuit 1 shown in FIG. 1, a quantization error corresponding to one of the first delay units 13 in the delay circuit 11 may possibly occur, which affects the frequency accuracy in the locking operation. The frequency accuracy error with respect to the cycle T is ±2×Tdel where Tdel is the delay of the first delay unit 13.

FIG. 1 shows only an example of the inner configurations of the delay circuit 11, the phase detector 12, and the oscillator 7, and their circuit configurations can be arbitrarily changed. The delay circuit 11 is only required to include the series-connected first delay units 13 for sequentially delaying the edge part at which the logic of the output signal from the first comparator 3 changes. The phase detector 12 is only required to be a circuit that determines the number of first delay units 13 corresponding to the signal propagation delay time, which further corresponds to a time difference between the time when the output signal from the first comparator 3 changes from LOW to HIGH and the time when the output signal from the second comparator 4 changes from LOW to HIGH, and outputs a bit sequence signal corresponding to the time difference. The oscillator 7 is only required to set the number of second delay units 16 connected in the ring oscillator 7 based on the bit sequence signal, and to output the oscillation signal having an oscillation cycle twice as long as the above-described time difference.

As described above, in the first embodiment, the delay circuit 11, the phase detector 12, and the oscillator 7 generates the oscillation signal having an oscillation cycle twice as long as the time difference between the time when the value of the linearly changing voltage generated by the voltage generator 2 matches the value of the first reference voltage VREF1 and the time when the linearly changing voltage matches the second reference voltage VREF2. This means that a high-frequency oscillation signal may be generated without using a reference clock signal inputted from outside, and that the oscillation frequency of such an oscillation signal may be promptly locked. Therefore, the oscillation circuit 1 according to the first embodiment may be used to generate a reference clock used for high-speed transmission.

Second Embodiment

In a second embodiment, the number of second delay units 16 in the oscillator 7 is reduced to increase the oscillation frequency by M times.

Figure 3:
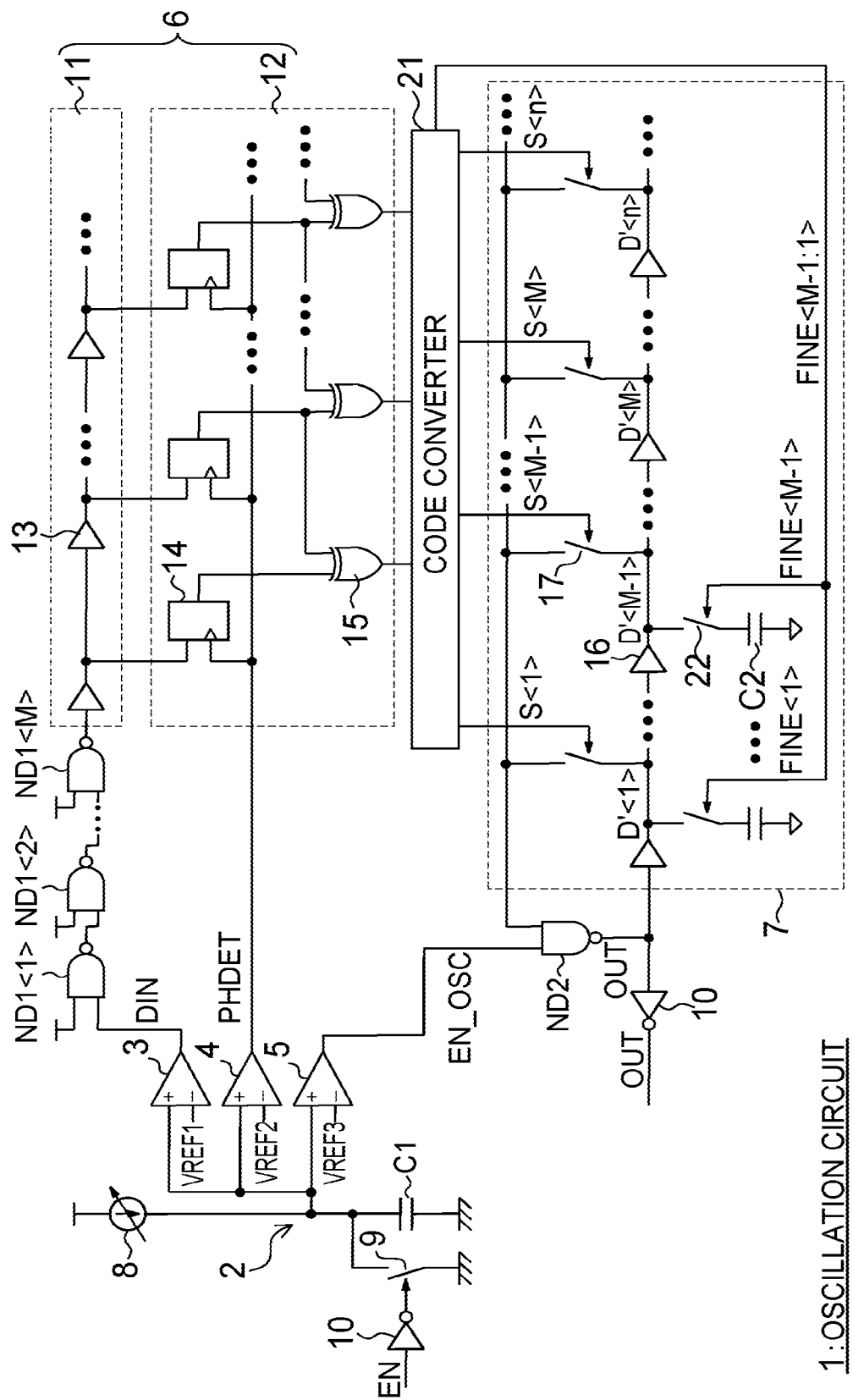
FIG. 3 is a circuit diagram of an oscillation circuit according to a second embodiment.

FIG. 3 is a circuit diagram of an oscillation circuit 1 according to the second embodiment. The oscillation circuit 1 shown in FIG. 3 includes a code converter 21 in addition to the configuration of the oscillation circuit 1 shown in FIG. 1. Instead of the single NAND gate ND1 connected between the output node of the first comparator 3 and the input node of the delay circuit 11 in the oscillation circuit 1 shown in FIG. 1, a plurality of NAND gates, such as a NAND gate ND1<1>, are connected in series between the output node of the first comparator 3 and the input node of the delay circuit 11 in the oscillation circuit 1 shown in FIG. 3. More specifically, in the oscillation circuit 1 shown in FIG. 3, M (an integer that is equal to or higher than 2) NAND gates ND1<1> to ND1<M> are connected between the output node of the first comparator 3 and the input node of the delay circuit 11. The M NAND gates ND1<1> to ND1<M> are for inverting and delaying the input signal, and may be replaced with other logic inverting elements such as inverters 10.

The code converter 21 generates a bit sequence signal that is obtained by dividing the bit sequence signal outputted from the time-to-digital converter 6 by M (an integer equal to or greater than 2). The value of M is equal to the value of the number of series-connected NAND gates ND1<1> to ND1<M>. In the second embodiment, the total number of NAND gate ND2 and second delay units 16 in the ring oscillator 7 matches 1/M of the total number of M NAND gates ND1<1> to ND1<M> and the number of first delay units 13 in the delay circuit 11, which can propagate a signal during a period T12 from the time when the value of the linearly changing voltage matches the value of the first reference voltage VREF1 to the time when the value of the linearly changing voltage matches the value of the second reference voltage VREF2, the period T12 being M/2 of the oscillation cycle.

The number of connected second delay units 16 in the ring oscillator 7, in which the NAND gate ND2 and the second delay units 16 are connected in a ring shape, is smaller than that in the ring oscillator 7 shown in FIG. 1, and the oscillation frequency of the ring oscillator 7 shown in FIG. 3 is M times the oscillation frequency of the oscillator 7 shown in FIG. 1.

The code converter 21 performs the code conversion of the bit sequence signal outputted from the time-to-digital converter 6 by dividing it by M. However, such a division may leave a remainder. A remainder signal FINE<M−1:1> indicating the remainder is outputted from the code converter 21.

A switch 22 and a capacitor C2 are connected in series between each output node of some of the second delay units 16 in the oscillator 7 and a ground node. The capacitor C2 is provided to adjust the delay time of the corresponding second delay unit 16. The switch 22 is turned on or off depending on the bit value corresponding to the remainder signal outputted from the code converter 21. For example, when the bit corresponding to the remainder signal is 1, the switch 22 is turned on to connect the capacitor C2 between the output node of the corresponding second delay unit 16 and the ground node.

Thus, the oscillator 7 performs the oscillation operation with an oscillation cycle that corresponds to 1/M times the bit sequence signal by adjusting the delay time of some of the second delay units 16 in the oscillator 7 using the remainder signal corresponding to the remainder of the division by M of the bit sequence signal outputted from the time-to-digital converter 6 by means of the code converter 21.

Figure 4:
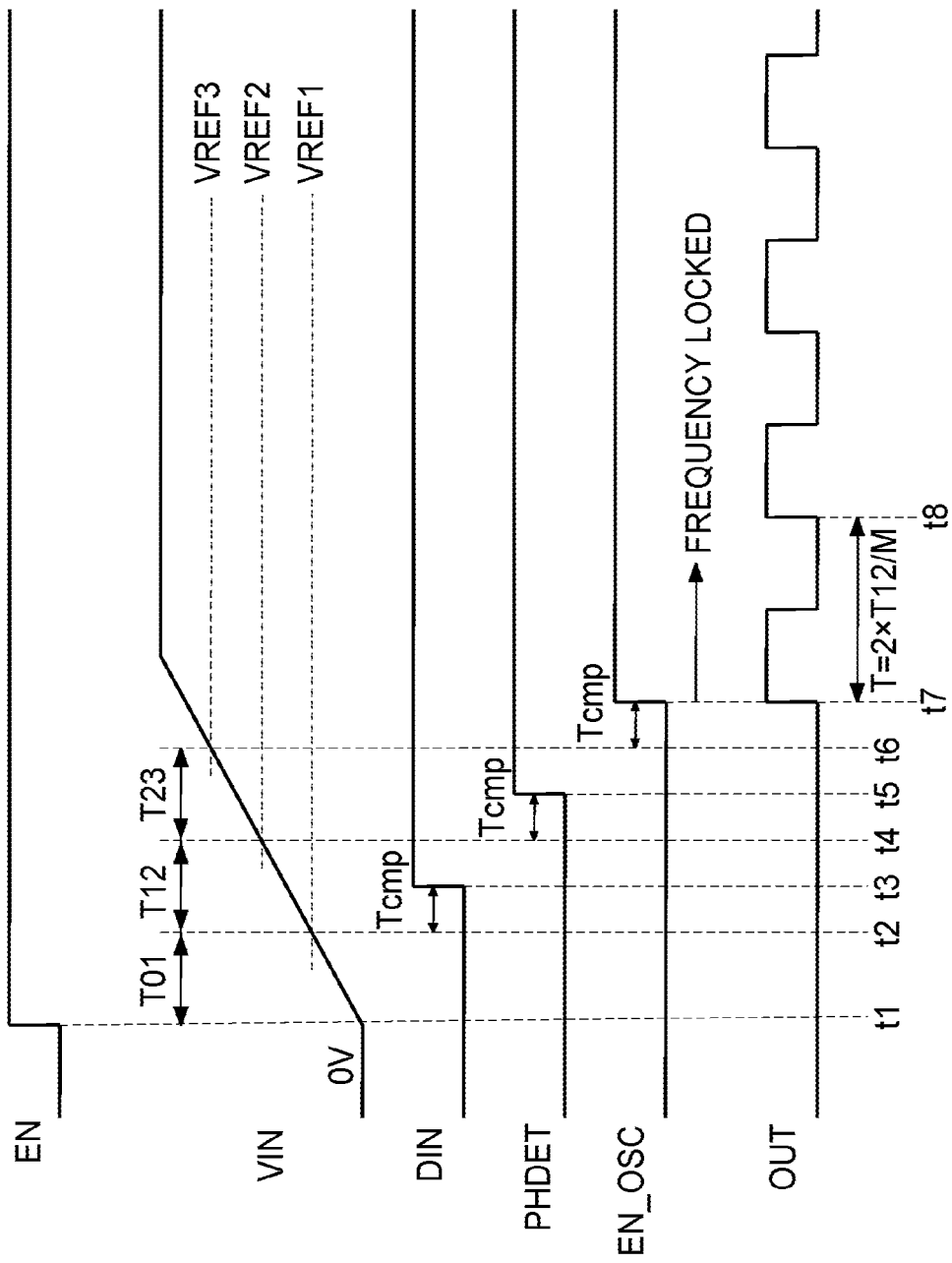
FIG. 4 is a timing chart of respective parts arranged in the oscillation circuit shown in FIG. 3.

FIG. 4 is a timing chart of respective parts arranged in the oscillation circuit 1 shown in FIG. 3. The operation before the oscillation operation starts at the oscillator 7 is the same as that shown in FIG. 2. The oscillation cycle T of the oscillator 7 shown in FIG. 4 is $T=2\times T12/M$, which corresponds to 1/M times the oscillation cycle shown in FIG. 2.

As described above, in the second embodiment, the oscillation frequency of the oscillator 7 may be increased to M times without complicating the inner configuration of the time-to-digital converter 6 by dividing the bit sequence signal outputted from the time-to-digital converter 6 by M at the code converter 21. Furthermore, the accuracy of the oscillation frequency may be improved since the delay time of some of the second delay units 16 in the oscillator 7 is adjusted using a remainder signal corresponding to the remainder of the division by M of the bit sequence signal at the code converter 21.

Third Embodiment

The oscillation frequency of the oscillation circuit 1 according to the first embodiment or the second embodiment may change when a factor such as the temperature or the voltage varies. In a third embodiment, the oscillation frequency does not change after the oscillation circuit 1 starts the oscillation operation.

Figure 5:
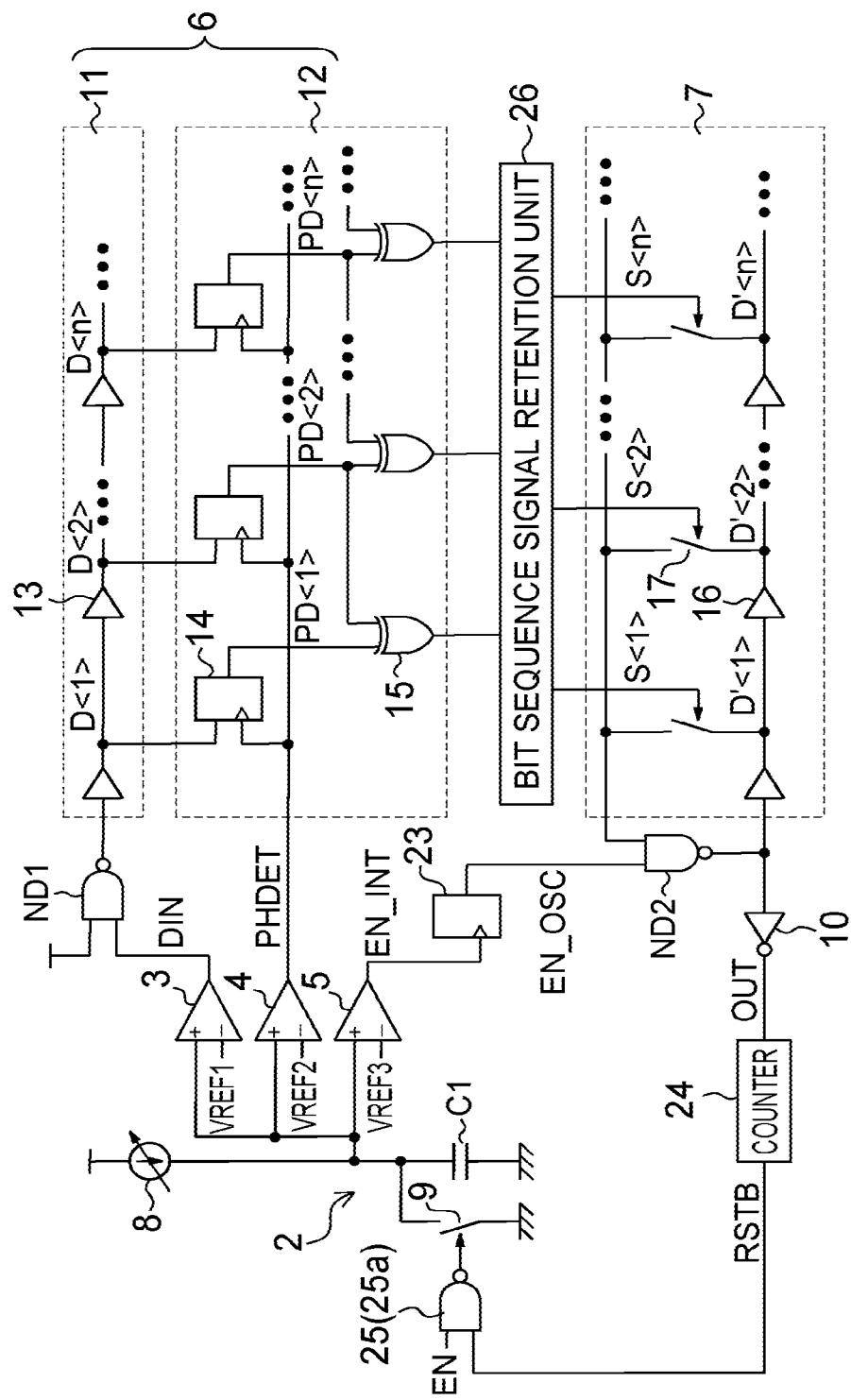
FIG. 5 is a circuit diagram of an oscillation circuit according to a third embodiment.

FIG. 5 is a circuit diagram of an oscillation circuit 1 according to the third embodiment. The oscillation circuit 1 shown in FIG. 5 includes an oscillation allowance maintaining unit 23, a counter 24, a regeneration instructing unit 25, and a bit sequence signal retention unit 26 in addition to the configuration of the oscillation circuit 1 shown in FIG. 1.

The oscillation allowance maintaining unit 23 allows the oscillator 7 to continue the generation of the oscillation signal after the time when the second comparator 4 detects that the value of the linearly changing voltage matches the value of the second reference voltage VREF2. Therefore, after starting the oscillation operation, the oscillator 7 continuously performs the oscillation operation irrespective of the output signal from the third comparator 5. The oscillation allowance maintaining unit 23 enables the oscillator 7 to continue the oscillation operation even if the value of the linearly changing voltage becomes smaller than the value of the third reference voltage VREF3 after the value of the linearly changing voltage matches the value of the third reference voltage VREF3. Therefore, the oscillation signal may be continuously outputted if the generation of the linearly changing voltage is stopped. This may reduce the power consumption.

The counter 24 counts the number of cycles of the oscillation signal generated by the oscillator 7. Every time the number of counted cycles of the oscillation signal reaches a predetermined value, the counter 24 adjusts the oscillation frequency.

The regeneration instructing unit 25 instructs the voltage generator 2 to regenerate the linearly changing voltage when the number of cycles counted by the counter 24 reaches the predetermined value. The regeneration instructing unit 25 includes, for example, a NAND gate 25a. The NAND gate 25a temporarily turns on the switch 9 in the voltage generator 2 when the enable signal EN is HIGH and the count value of the counter 24 reaches the predetermined value to let the capacitor C1 to discharge the accumulated charge, and then turns off the switch 9 and let the linearly changing voltage to be regenerated.

The bit sequence signal retention unit 26 retains the bit sequence signal that is first outputted from the time-to-digital converter 6 when the voltage generator 2 first generates or regenerates the linearly changing voltage. Since the bit sequence signal retention unit 26 is provided, the bit sequence signal changes only once every time the voltage generator 2 regenerates the linearly changing voltage. Therefore, the oscillation frequency of the oscillator 7 does not vary.

Figure 6:
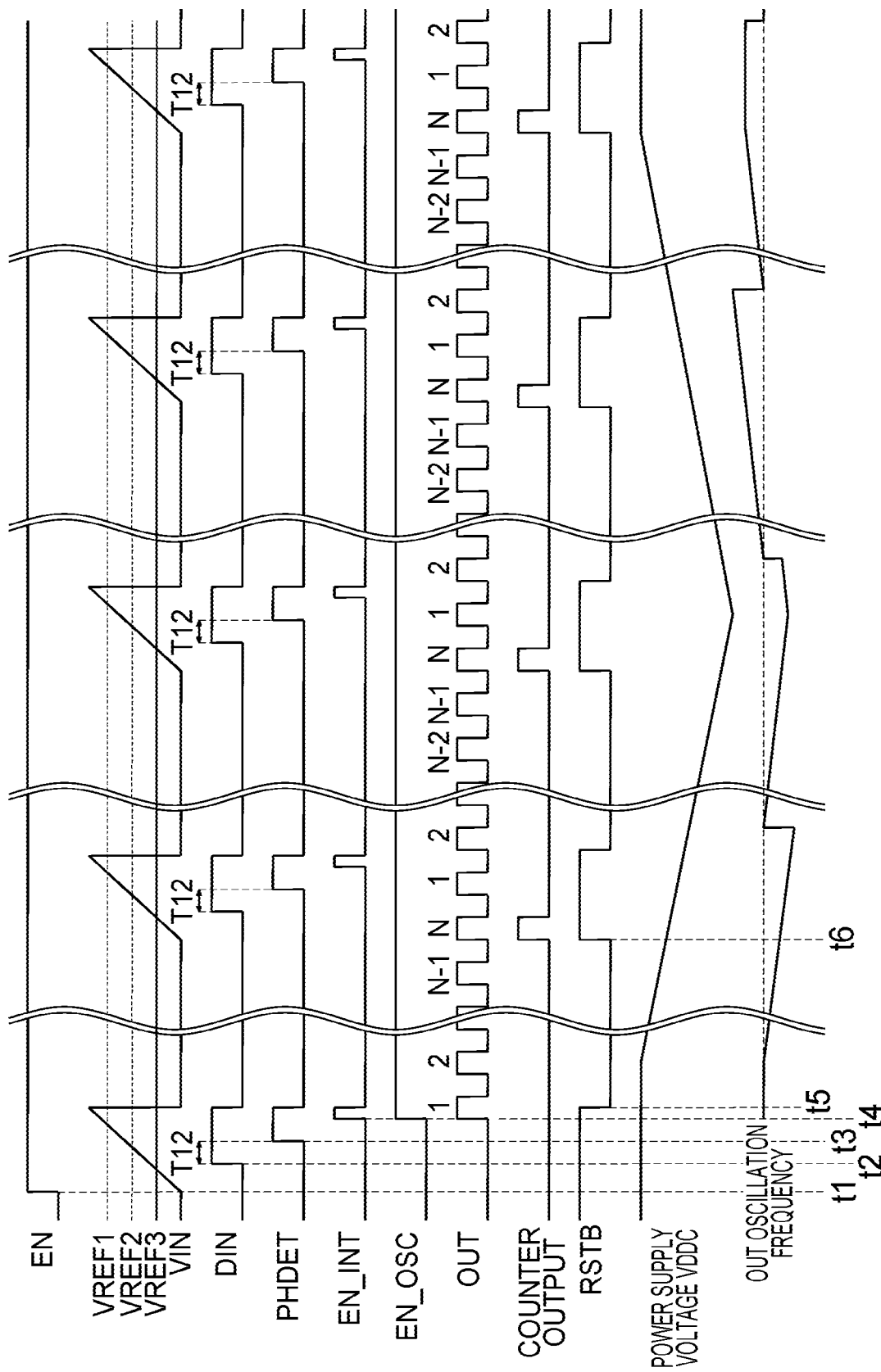
FIG. 6 is an operation timing chart of respective parts arranged in the oscillation circuit shown in FIG. 5.

FIG. 6 is an operation timing chart of respective parts arranged in the oscillation circuit 1 shown in FIG. 5. When the enable signal EN becomes HIGH at time t1, the voltage generator 2 starts generating the linearly changing voltage. At time t2, the output signal from the first comparator 3 becomes HIGH, and at time t3, the output signal from the second comparator 4 becomes HIGH. The period between time t2 and time t3 is denoted by T12. During the period T12, the NAND gate ND1 and some of the first delay units 13 in the delay circuit 11 convey the output signal edge of the first comparator 3. When the output signal from the second comparator 4 becomes HIGH at time t3, each of the retention units 14 of the phase detector 12 included in the time-to-digital converter 6 retains the output signal of the corresponding first delay unit 13.

Each of the EXOR gates 15 in the phase detector 12 outputs the calculation result of the exclusive OR of the output signals from adjacent two retention units 14. Therefore, the output of the EXOR gate 15 connected to the retention unit 14 retaining the output signal of the delay unit 13 that is the first not to receive the output signal edge of the first comparator 3 within the period T12 is HIGH, and the outputs of all of the EXOR gates 15 that are connected before the aforementioned EXOR gate 15 are LOW. Thus, the output signals from the EXOR gates 15 indicate until which first delay unit 13 the output signal from the first comparator 3 reaches within the period T12.

When the output signal from the third comparator 5 becomes HIGH at time t4, the oscillation allowance maintaining unit 23 allows the oscillator 7 to continuously generate the oscillation signal, and the bit sequence signal retention unit 26 retains the bit sequence signal first outputted from the time-to-digital converter 6.

The oscillator 7 therefore performs the oscillation operation at a constant oscillation frequency until the next time the voltage generator 2 regenerates the linearly changing voltage.

When the oscillator 7 outputs a first oscillation pulse, the output signal RSTB from the counter 24 changes from HIGH to LOW (time t5). When the output signal RSTB from the counter 24 becomes LOW, the switch 9 in the voltage generator 2 is turned ON to let the capacitor C1 in the voltage generator 2 discharge. As the result, the output voltage from the voltage generator 2 becomes 0V.

After time t4, the oscillator 7 continues the oscillation operation at the constant oscillation frequency, and the counter 24 counts the number of oscillation cycles of the oscillation signal. The power supply voltage VDDC and the temperature do not always keep the same level, but may vary. FIG. 6 shows an example where the power supply voltage VDDC gradually decreases. If the power supply voltage VDDC decreases, the oscillation frequency of the oscillation signal, which should be at a constant value, decreases.

At time t6, the count value of the counter 24 reaches the predetermined value, and the output signal from the counter 24 becomes HIGH. This causes the switch 9 in the voltage generator 2 to be turned OFF, and the voltage generator 2 to regenerate the linearly changing voltage. Thereafter, the same operation as having been performed from time t1 to time t5 is repeated, and the oscillation signal from the oscillator 7 is corrected to have the original oscillation frequency. Such an operation for correcting the oscillation frequency is performed every time the count value of the counter 24 reaches the predetermined number.

Figure 7:
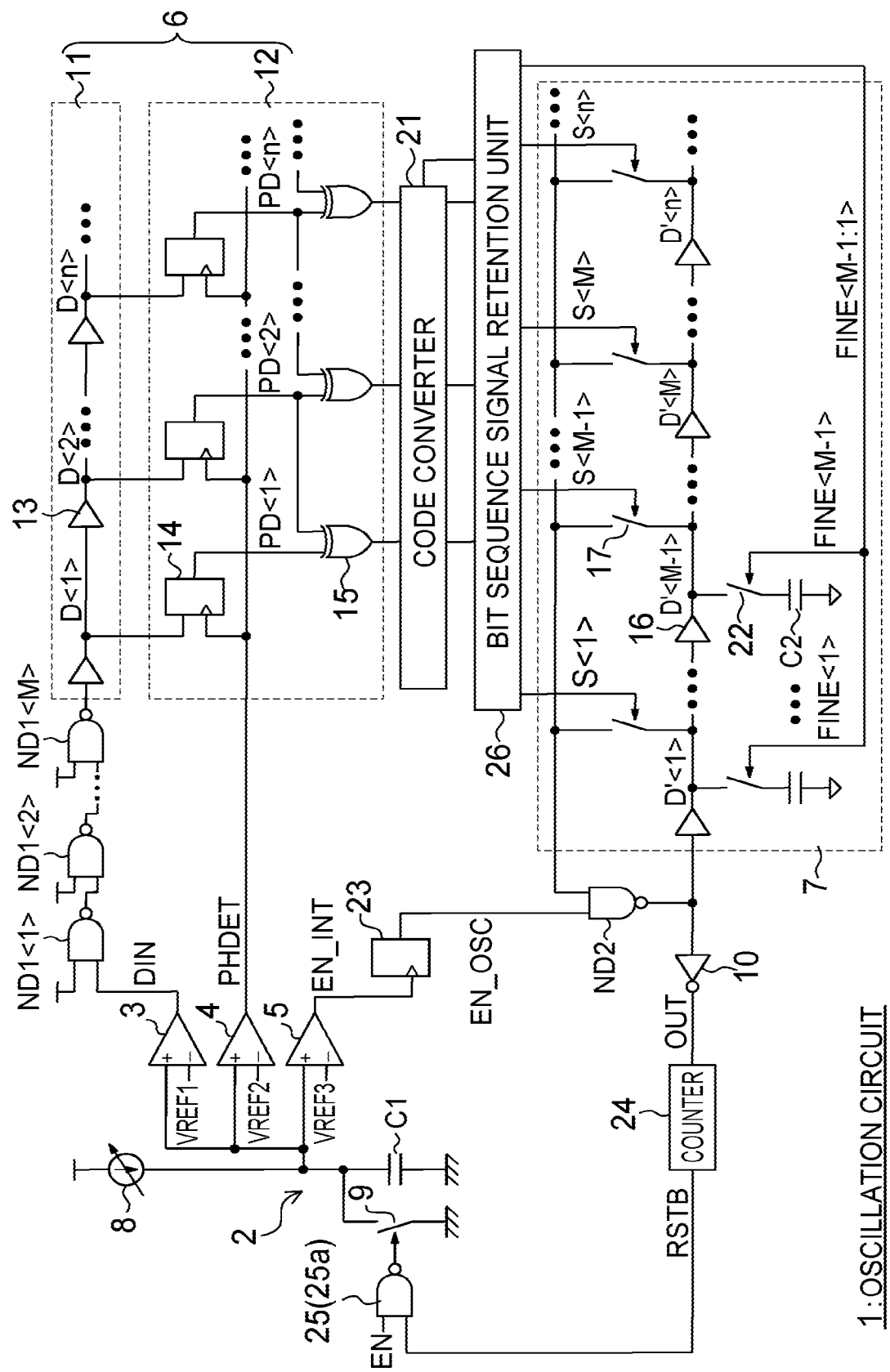
FIG. 7 is a circuit diagram of a modification of the oscillation circuit shown in FIG. 5.

FIG. 7 is a circuit diagram of a modification of the oscillation circuit 1 shown in FIG. 5, which includes an oscillation allowance maintaining unit 23, a counter 24, a regeneration instructing unit 25, and a bit sequence signal retention unit 26 in addition to the configuration of the oscillation circuit 1 shown in FIG. 3. The bit sequence signal retention unit 26 retains the bit sequence signal converted at the code converter 21. The bit sequence signal retained by the bit sequence signal retention unit 26 is supplied to the second delay units 16 in the oscillator 7. The operation of the oscillation circuit 1 shown in FIG. 7 is the same as that shown in FIGS. 5 and 6, and no detailed description is provided for it.

Figure 8:
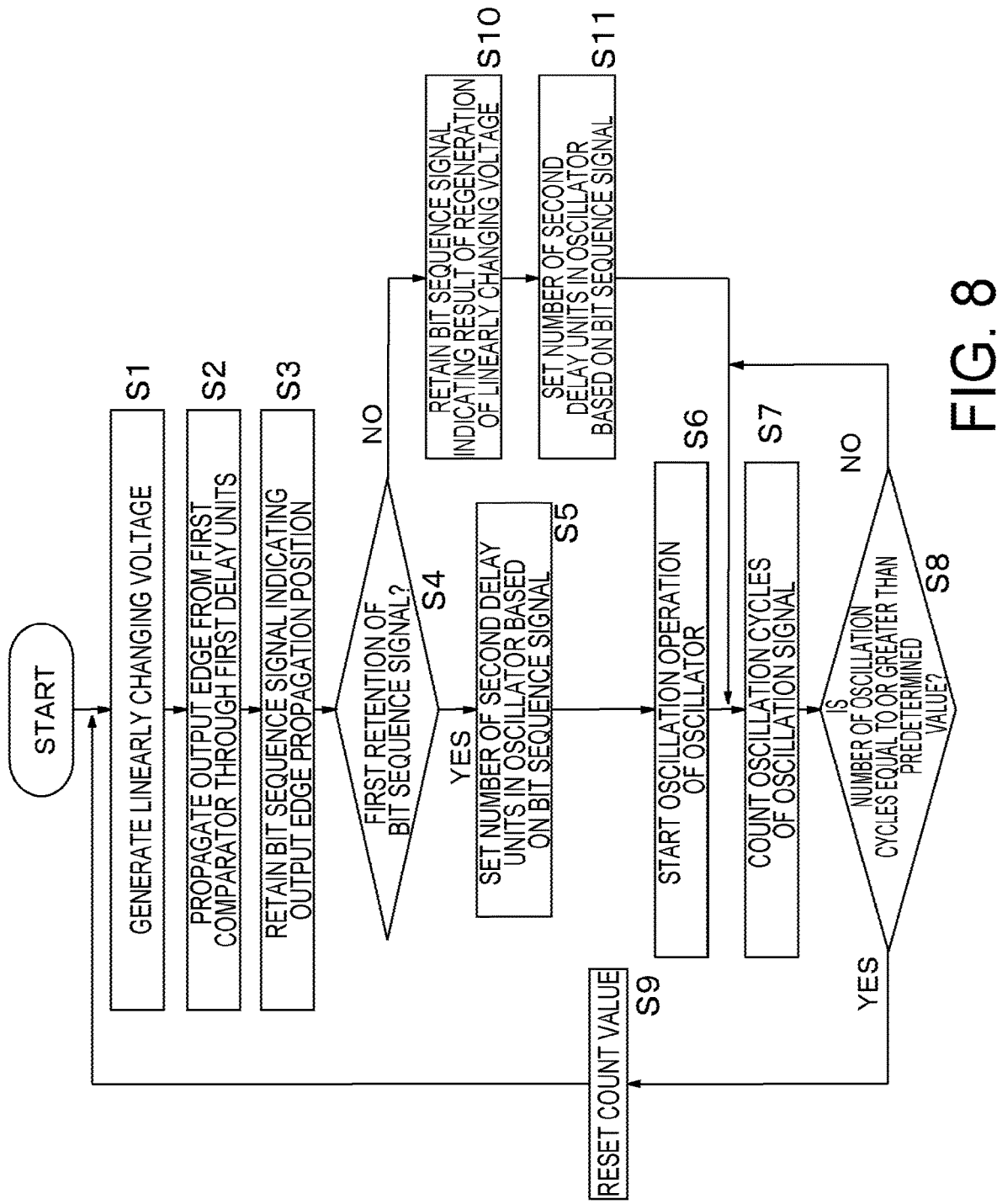
FIG. 8 is a flowchart of an operation of the oscillation circuit according to the third embodiment.

FIG. 8 is a flowchart of an operation of the oscillation circuit 1 according to the third embodiment. This flowchart is for the operation of the oscillation circuit 1 shown in FIG. 5 or FIG. 7. While the power supply voltage is supplied, the oscillation circuit 1 continues the operation according to the flowchart shown in FIG. 8.

First, the enable signal EN is changed from LOW to HIGH so that the voltage generator 2 generates the linearly changing voltage (step S1). The change in the output signal (output edge) from the first comparator 3 is then propagated to the NAND gate ND1 and the first delay units 13 in the delay circuit 11 (step S2). The output signal from the first comparator 3 changes from LOW to HIGH at the time when the linearly changing voltage matches the first reference voltage VREF1. Therefore, the NAND gate ND1 and the first delay units 13 propagate the output edge from LOW to HIGH of the output signal from the first comparator 3.

The phase detector 12 retains the bit sequence signal indicating the number of first delay units 13 that have received the output edge (step S3).

It is then determined whether the bit sequence signal is retained for the first time (step S4). If the bit sequence signal is retained for the first time, the number of the second delay units in the oscillator 7 is set based on the bit sequence signal (step S5), and the oscillation operation of the oscillator 7 is started (step S6).

The number of oscillation cycles of the oscillation signal outputted from the oscillator 7 is then counted (step S7), and whether the count value is equal to or greater than a predetermined value is determined (step S8). The processes of steps S7 to S8 are repeated until the count value reaches the predetermined value.

When the count value reaches the predetermined value, the counter 24 resets the count value (step S9), and repeats the processes at and after step S1.

If it is determined at step S4 that it is not the first retention of the bit sequence signal, the bit sequence signal retention unit 26 retains a bit sequence other than the bit sequence retained and inputted to the oscillator 7. In other words, the bit sequence signal retention unit 26 retains a bit sequence indicating the result of the regeneration of the linearly changing voltage (step S10). The bit sequence signal retained at the bit sequence signal retention unit 26 does not change until the voltage generator 2 regenerates the linearly changing voltage.

The number of connected second delay units 16 in the oscillator 7 is then reset based on the bit sequence signal retained in the bit sequence signal retention unit 26 (step S11), and the processes at and after step S7 are repeated. At step S11, the number of connected second delay units 16 is reset at appropriate timing. For example, if the bit sequence signal retained the last time is compared with the bit sequence signal retained this time and the code is varied by only 1 bit, the switching position may be changed after the signal passing through the switch 17 used last time becomes LOW.

As described above, in the third embodiment, after the oscillator 7 starts the oscillation operation, the bit sequence signal outputted from the phase detector 12 does not change until the voltage generator 2 regenerates the linearly changing voltage, and the oscillator 7 continuously performs the oscillation operation. Therefore, the oscillation state of the oscillation circuit 1 may be stably maintained.

Fourth Embodiment

An interface circuit according to a fourth embodiment includes the oscillation circuit 1 according to any of the first to third embodiments.

Figure 9:
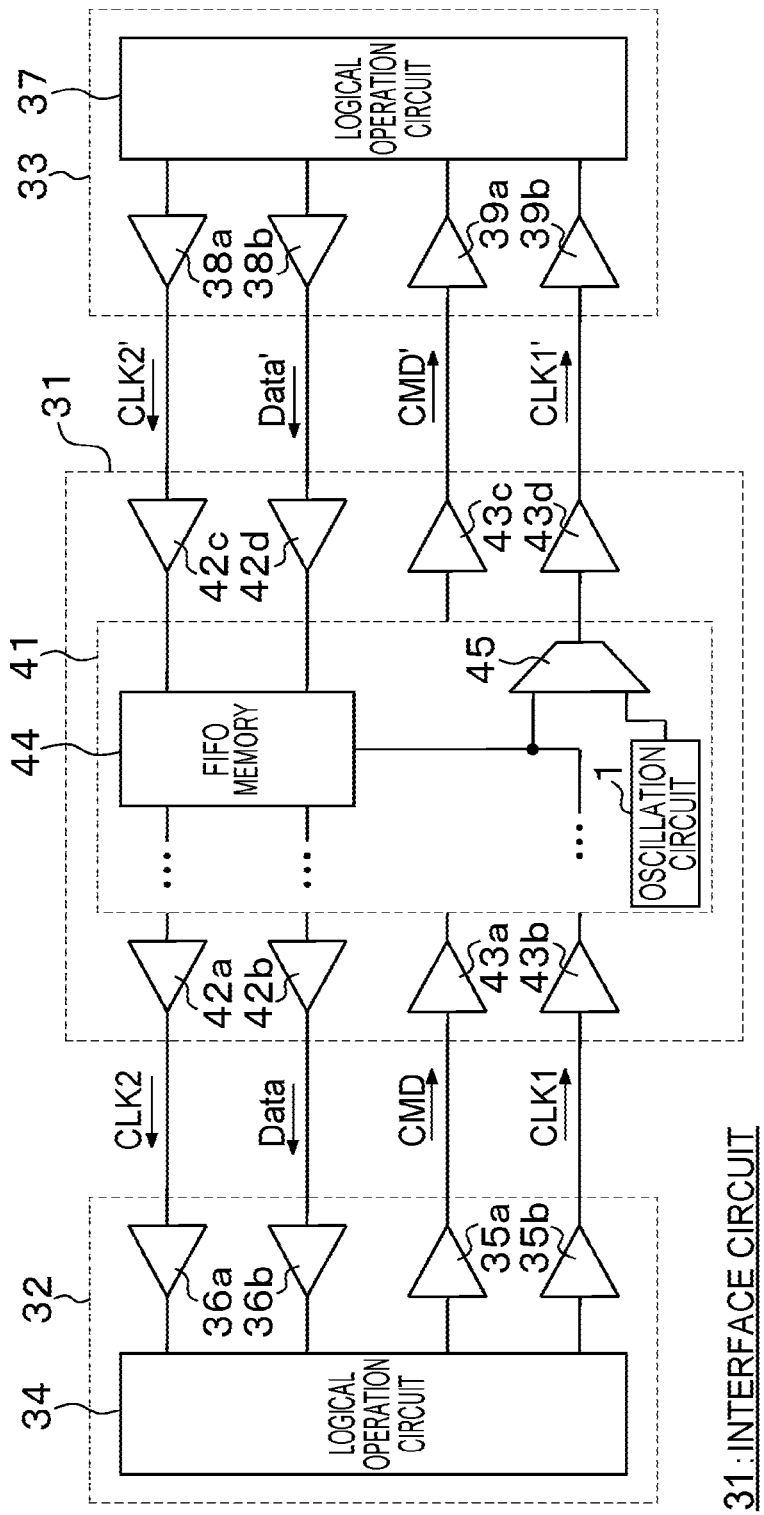
FIG. 9 is a block diagram showing a schematic configuration of an interface circuit according to a fourth embodiment.

FIG. 9 is a block diagram showing a schematic configuration of the interface circuit 31 according to the fourth embodiment. The interface circuit 31 shown in FIG. 9 has a function to transfer a signal between the first signal processing unit 32 and the second signal processing unit 33. The first signal processing unit 32 and the second signal processing unit may be formed of different semiconductor chips. The interface circuit 31 may also be formed of a semiconductor chip that is different from those of the first signal processing unit 32 and the second signal processing unit 33. Alternatively, the interface circuit 31, the first signal processing unit 32, and the second signal processing unit 33 may be installed on different circuit boards.

The first signal processing unit 32 includes a logical operation circuit 34, transmission drivers 35a and 35b, and reception drivers 36a and 36b. Similarly, the second signal processing unit 33 includes a logical operation circuit 37, transmission drivers 38a and 38b, and receivers 39a and 39b. The first signal processing unit 32 and the second signal processing unit 33 may include a further processing block other than those illustrated.

The interface circuit 31 includes a logical operation circuit 41, transmission drivers 42a, 42b, 43c, and 43d, and receivers 43a, 43b, 42c, and 42d. The logical operation circuit 41 in the interface circuit 31 has an oscillation circuit 1 according to any of the first to third embodiments, a first-in first-out (FIFO) memory 44, and a multiplexer 45.

The FIFO memory 44 is capable of writing and reading at a high speed, and used to temporarily store data transmitted from the second signal processing unit 33. When receiving a clock signal CLK1 transmitted from the first signal processing unit 32, the FIFO memory 44 sequentially reads the stored data and transmits the data to the first signal processing unit 32.

The multiplexer 45 selects either the clock signal CLK1 transmitted from the first signal processing unit 32 or the oscillation signal generated by the oscillation circuit 1, and transmits the selected signal as a clock signal CLK1' to the second signal processing unit 33 via the transmission driver 43d.

Figure 10:
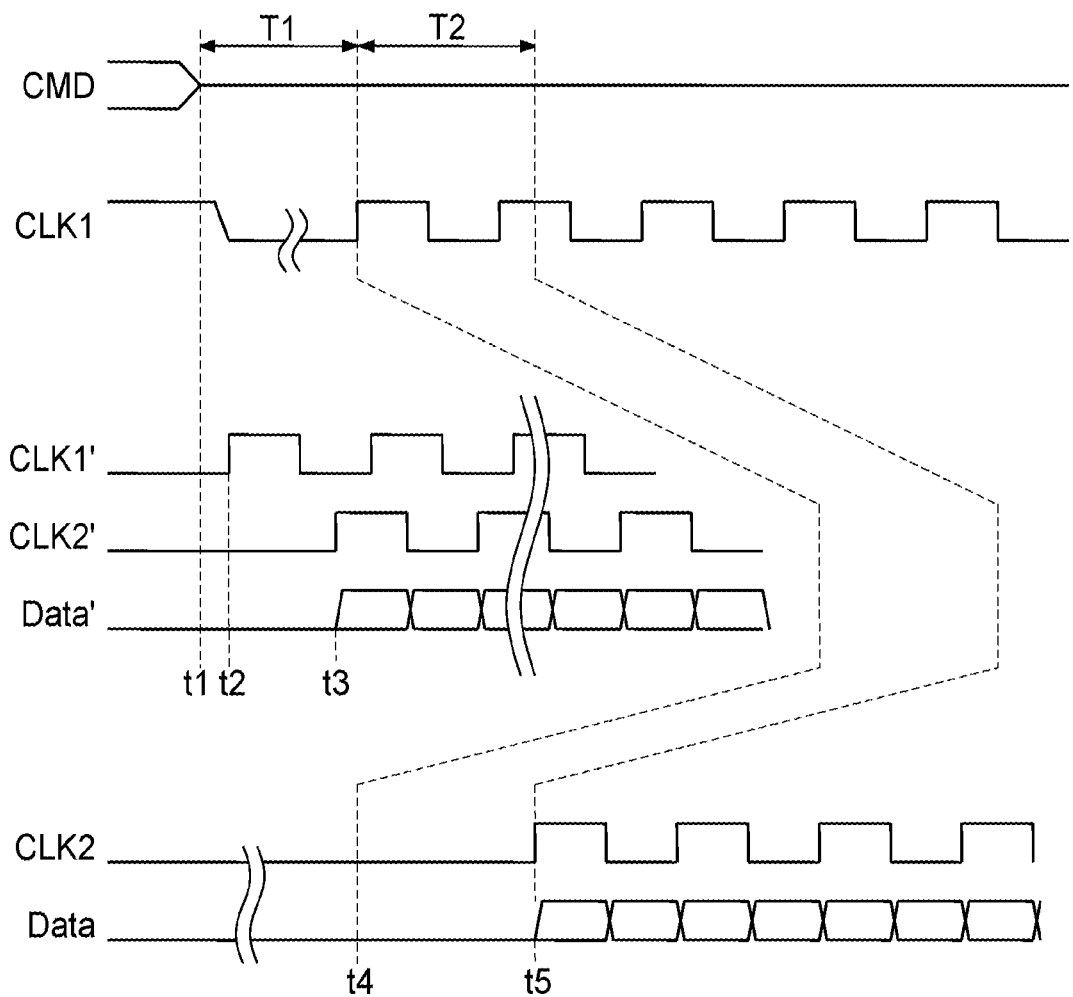
FIG. 10 is an operation timing diagram of the interface circuit shown in FIG. 9.

FIG. 10 is an operation timing diagram of the interface circuit 31 shown in FIG. 9. First, at time t1, a signal CMD transmitted from the first signal processing unit 32 is inputted to the interface circuit 31. The multiplexer 45 then selects the oscillation signal generated by the oscillation circuit 1 during a period of time T1 until the clock signal CLK1 is inputted.

During the period of time T1, the oscillation circuit 1 according to any of the first to third embodiments outputs the oscillation signal CLK' (at and after time t2). The oscillation signal CLK' is transmitted from the interface circuit 31 to the second signal processing unit 33 via the transmission driver 43d. Upon the receipt of the oscillation signal CLK1', the second signal processing unit 33 transmits data Data' to the interface circuit 31 in synchronization with a clock signal CLK2' (at and after time t3). Upon the receipt of the clock signal CLK2' and the data Data', the interface circuit 31 sequentially stores the received data Data' in the FIFO memory 44. When the clock signal CLK2' is not inputted anymore, the oscillation circuit 1 stops the oscillation operation.

Thereafter, at time t4, the first signal processing unit 32 transmits the clock signal CLK1 to the interface circuit 31, and at time t5, the interface circuit 31 transmits data Data read from the FIFO memory 44 to the first signal processing unit 32 in synchronization with a clock signal CLK2 generated based on the clock signal CLK1.

As described above, in the interface circuit 31 shown in FIG. 9, the oscillation circuit 1 rapidly generates the stable clock signal CLK1' and transmits it to the second signal processing unit 33 in the period of time T1 after the first signal processing unit 32 outputs the signal CMD and before it outputs the clock signal CLK1. The data Data' transmitted from the second signal processing unit 33 is sequentially stored in the FIFO memory 44. The interface circuit 31 may therefore sequentially transmits the data Data from the FIFO memory 44 to the first signal processing unit 32 when the first signal processing unit 32 outputs the clock signal CLK1. The interface circuit 31 thus performs the data transmission/reception between the first signal processing unit 32 and the second signal processing unit 33 rapidly without losing any part of the data.

While certain embodiments have been described, these embodiments have been presented by way of example only, and are not intended to limit the scope of the inventions. These novel embodiments may be embodied in a variety of other forms. Furthermore, various omissions, substitutions and changes may be made without departing from the spirit of the inventions. The accompanying claims and their equivalents are intended to cover such embodiments and their modifications as would fall within the scope and spirit of the inventions.

The invention claimed is:
1. An oscillation circuit comprising:
a voltage generator configured to generate a linearly changing voltage, a voltage level of which linearly changes as time passes;

a first comparator configured to compare the linearly changing voltage with a first reference voltage;

a second comparator configured to compare the linearly changing voltage with a second reference voltage having a higher voltage level than the first reference voltage;

a time-to-digital converter configured to output a bit sequence signal in accordance with a time difference between a time when the first comparator detects that the linearly changing voltage matches the first reference voltage and a time when the second comparator detects that the linearly changing voltage matches the second reference voltage; and an oscillator configured to generate an oscillation signal that oscillates at a frequency according to the bit sequence signal.

2. The oscillation circuit according to claim 1, further comprising a third comparator configured to compare the linearly changing voltage with a third reference voltage having a higher voltage level than the second reference voltage, wherein the oscillator starts an oscillation operation after a time when the third comparator detects that the linearly changing voltage matches the third reference voltage.

3. The oscillation circuit according to claim 1, wherein the time-to-digital converter comprises:

a delay circuit including a plurality of first delay units connected in series, the first delay units having the same a signal propagation delay time and propagating an output signal from the first comparator while delaying the output signal; and a phase detector configured to generate the bit sequence signal based on output signals from the first delay units, the phase detector including a plurality of retention units each corresponding to one of the first delay units to retain the output signal from the one of the first delay units at a time when the second comparator detects that the linearly changing voltage matches the second reference voltage, wherein the bit sequence signal corresponds to signals retained by the retention units.

4. The oscillation circuit according to claim 3, wherein the oscillator comprises a ring oscillator including a plurality of second delay units connected to form a ring shape, a number of second delay units connected is changeable depending on a number of first delay units that have propagated an output signal edge from the first comparator during a period of time from the time when the first comparator detects that the linearly changing voltage matches the first reference voltage to the time when the second comparator detects that the linearly changing voltage matches the second reference voltage.

5. The oscillation circuit according to claim 4, wherein the number of second delay units connected in the ring oscillator is the same as the number of first delay units that have propagated an edge of the output signal from the first comparator during the period of time from the time when the first comparator detects that the linearly changing voltage matches the first reference voltage to the time when the second comparator detects that the linearly changing voltage matches the second reference voltage.

6. The oscillation circuit according to claim 1, wherein the oscillator generates the oscillation signal having an oscillation cycle twice as long as the time difference.

7. The oscillation circuit according to claim 1, further comprising a code converter configured to generate a further bit sequence signal that is 1/M times the bit sequence signal outputted from the time-to-digital converter, where M is an integer equal to or greater than 2, wherein the oscillator generates the oscillation signal oscillating at a frequency in accordance with the further bit sequence signal.

8. The oscillation circuit according to claim 6, wherein:

the code converter outputs a remainder signal corresponding to a remainder obtained when the bit sequence signal divided by M; and the oscillator slightly adjusts the frequency of the oscillation signal based on the remainder signal.

9. The oscillation circuit according to claim 6, wherein the oscillator generates the oscillation signal having a frequency obtained by dividing twice as long as the time difference by M.

10. The oscillation circuit according to claim 1, further comprising:

an oscillation allowance maintaining unit configured to allow the oscillator to continuously generate the oscillation signal after the second comparator detects that the linearly changing voltage matches the second reference voltage;

a counter configured to count cycles of the oscillation signal generated by the oscillator;

a regeneration instructing unit configured to instruct the voltage generator to regenerate the linearly changing voltage when the cycles counted at the counter reaches a predetermined value; and a bit sequence signal retention unit configured to retain the bit sequence signal first outputted from the time-to-digital converter when the voltage generator first generates the linearly changing voltage, or the voltage generator regenerates the linearly changing voltage.

11. An interface circuit configured to transfer data and a clock signal between a first signal processing unit and a second signal processing unit, comprising:

a memory unit configured to temporarily store the data; and an oscillation circuit configured to generate an oscillation signal having a predetermined oscillation frequency, the oscillation circuit including:

a voltage generator configured to generate a linearly changing voltage, a voltage level of which linearly changes as time passes;

a first comparator configured to compare the linearly changing voltage with a first reference voltage;

a second comparator configured to compare the linearly changing voltage with a second reference voltage having a higher voltage level than the first reference voltage;

a time-to-digital converter configured to output a bit sequence signal in accordance with a time difference between a time when the first comparator detects that the linearly changing voltage matches the first reference voltage and a time when the second comparator detects that the linearly changing voltage matches the second reference voltage; and an oscillator configured to generate an oscillation signal that oscillates at a frequency according to the bit sequence signal.

12. The interface circuit according to claim 11, further comprising a third comparator configured to compare the linearly changing voltage with a third reference voltage having a higher voltage level than the second reference voltage,
  wherein the oscillator starts an oscillation operation after a time when the third comparator detects that the linearly changing voltage matches the third reference voltage.

13. The interface circuit according to claim 11, wherein the time-to-digital converter comprises:
  a delay circuit including a plurality of first delay units connected in series, the first delay units having the same a signal propagation delay time and propagating an output signal from the first comparator while delaying the output signal; and
  a phase detector configured to generate the bit sequence signal based on output signals from the first delay units, the phase detector including a plurality of retention units each corresponding to one of the first delay units to retain the output signal from the one of the first delay units at a time when the second comparator detects that the linearly changing voltage matches the second reference voltage,
  wherein the bit sequence signal corresponds to signals retained by the retention units.

14. The interface circuit according to claim 13, wherein the oscillator comprises a ring oscillator including a plurality of second delay units connected to form a ring shape, a number of second delay units connected is changeable depending on a number of first delay units that have propagated an output signal edge from the first comparator during a period of time from the time when the first comparator detects that the linearly changing voltage matches the first reference voltage to the time when the second comparator detects that the linearly changing voltage matches the second reference voltage.

15. The interface circuit according to claim 14, wherein the number of second delay units connected in the ring oscillator is the same as the number of first delay units that have propagated an edge of the output signal from the first comparator during the period of time from the time when the first comparator detects that the linearly changing voltage matches the first reference voltage to the time when the second comparator detects that the linearly changing voltage matches the second reference voltage.

16. The interface circuit according to claim 11, wherein the oscillator generates the oscillation signal having an oscillation cycle twice as long as the time difference.

17. The interface circuit according to claim 11, further comprising a code converter configured to generate a further bit sequence signal that is 1/M times the bit sequence signal outputted from the time-to-digital converter, where M is an integer equal to or greater than 2,
  wherein the oscillator generates the oscillation signal oscillating at a frequency in accordance with the further bit sequence signal.

18. The interface circuit according to claim 16, wherein:
  the code converter outputs a remainder signal corresponding to a remainder obtained when the bit sequence signal divided by M; and
  the oscillator slightly adjusts the frequency of the oscillation signal based on the remainder signal.

19. The interface circuit according to claim 16, wherein the oscillator generates the oscillation signal having a frequency obtained by dividing twice as long as the time difference by M.

20. The interface circuit according to claim 11, further comprising:
  an oscillation allowance maintaining unit configured to allow the oscillator to continuously generate the oscillation signal after the second comparator detects that the linearly changing voltage matches the second reference voltage;
  a counter configured to count cycles of the oscillation signal generated by the oscillator;
  a regeneration instructing unit configured to instruct the voltage generator to regenerate the linearly changing voltage when the cycles counted at the counter reaches a predetermined value; and
  a bit sequence signal retention unit configured to retain the bit sequence signal first outputted from the time-to-digital converter when the voltage generator first generates the linearly changing voltage, or the voltage generator regenerates the linearly changing voltage.

* * * * *